US009224460B2

(12) United States Patent
Tominaga et al.

(10) Patent No.: US 9,224,460 B2
(45) Date of Patent: *Dec. 29, 2015

(54) SOLID MEMORY

(71) Applicant: NATIONAL INSTITUTE OF ADVANCED INDUSTRIAL SCIENCE AND TECHNOLOGY, Tokyo (JP)

(72) Inventors: Junji Tominaga, Tsukuba (JP); James Paul Fons, Tsukuba (JP); Alexander Kolobov, Tsukuba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 46 days.

This patent is subject to a terminal disclaimer.

(21) Appl. No.: 13/923,447

(22) Filed: Jun. 21, 2013

(65) Prior Publication Data
US 2013/0286725 A1 Oct. 31, 2013

Related U.S. Application Data

(63) Continuation of application No. 12/733,295, filed as application No. PCT/JP2008/060856 on Jun. 13, 2008, now abandoned.

(30) Foreign Application Priority Data

Aug. 31, 2007 (JP) .................................. 2007-225978

(51) Int. Cl.
*G11C 13/00* (2006.01)
*H01L 45/00* (2006.01)
(Continued)

(52) U.S. Cl.
CPC ............. *G11C 13/0004* (2013.01); *B82Y 10/00* (2013.01); *G11B 7/2433* (2013.01);
(Continued)

(58) Field of Classification Search
CPC ..... H01L 45/06; H01L 45/065; H01L 45/141; H01L 45/144; G11C 13/0002; G11C 13/0004
USPC ....................... 257/2, E45.002; 365/148, 163
See application file for complete search history.

(56) References Cited

U.S. PATENT DOCUMENTS 5,187,052 A * 2/1993 Maeda et al. ............ 430/270.13
5,341,328 A    8/1994 Ovshinsky et al.
(Continued)

FOREIGN PATENT DOCUMENTS

JP      08-085261      4/1996 ............... B41M 5/26
JP     08106647 A *   4/1996 ............... G11B 7/24
(Continued)

OTHER PUBLICATIONS

English translation of JP 08106647.*
(Continued)

*Primary Examiner* — Allison P Bernstein
(74) *Attorney, Agent, or Firm* — Harness, Dickey & Pierce, P.L.C.

(57) ABSTRACT

Recording and erasing of data in PRAM have hitherto been performed based on a change in physical characteristics caused by primary phase-transformation of a crystalline state and an amorphous state of a chalcogen compound including Te which serves as a recording material. Since, however, a recording thin film is formed of a polycrystal but not a single crystal, a variation in resistance values occurs and a change in volume caused upon phase-transition has placed a limit on the number of times of readout of the record. In one embodiment, the above problem is solved by preparing a solid memory having a superlattice structure with a thin film containing Sb and a thin film containing Te. The solid memory can realize the number of times of repeated recording and erasing of $10^{15}$.

20 Claims, 4 Drawing Sheets a combined state

(51) Int. Cl.

| | |
|---|---|
| *B82Y 10/00* | (2011.01) |
| *G11B 7/2433* | (2013.01) |
| *G11B 7/243* | (2013.01) |
| *H01L 29/15* | (2006.01) |
| *H01L 29/18* | (2006.01) |

(52) U.S. Cl.
CPC ............ *H01L 45/06* (2013.01); *H01L 45/144* (2013.01); *H01L 45/1625* (2013.01); *G11B 2007/24314* (2013.01); *G11B 2007/24316* (2013.01); *H01L 29/15* (2013.01); *H01L 29/18* (2013.01)

(56) References Cited

U.S. PATENT DOCUMENTS

| | | | |
|---|---|---|---|
| 5,514,440 A * | 5/1996 | Gotoh et al. | 428/64.2 |
| 5,596,522 A * | 1/1997 | Ovshinsky et al. | 365/113 |
| 5,825,046 A | 10/1998 | Czubatyl et al. | 257/2 |
| 6,087,674 A | 7/2000 | Ovshinsky et al. | 257/2 |
| 7,692,176 B2 | 4/2010 | Ha et al. | 257/4 |
| 8,396,335 B2 | 3/2013 | Tominaga et al. | 385/2 |
| 2002/0131309 A1 | 9/2002 | Nishihara et al. | 365/200 |
| 2004/0165422 A1 | 8/2004 | Hideki et al. | 365/163 |
| 2004/0178401 A1 | 9/2004 | Ovshinsky et al. | 257/2 |
| 2004/0178402 A1 | 9/2004 | Ovshinsky et al. | 257/2 |
| 2004/0178403 A1 | 9/2004 | Ovshinsky | 257/4 |
| 2004/0178404 A1 | 9/2004 | Ovshinsky | 257/4 |
| 2004/0179394 A1 | 9/2004 | Ovshinsky et al. | 365/163 |
| 2005/0002227 A1 | 1/2005 | Hideki et al. | 365/163 |
| 2006/0011942 A1 | 1/2006 | Kim et al. | 257/192 |
| 2006/0039192 A1 | 2/2006 | Ha et al. | 365/163 |
| 2006/0118774 A1 | 6/2006 | Ovshinsky | 257/8 |
| 2006/0172067 A1 | 8/2006 | Ovshinsky et al. | 427/248.1 |
| 2006/0172068 A1 | 8/2006 | Ovshinsky et al. | 427/248.1 |
| 2006/0209495 A1 | 9/2006 | Lee et al. | 361/502 |
| 2006/0234462 A1 | 10/2006 | Ovshinsky et al. | 438/382 |
| 2006/0281217 A1 | 12/2006 | Hideki et al. | 438/102 |
| 2007/0054475 A1 | 3/2007 | Lee et al. | |
| 2007/0160760 A1 | 7/2007 | Shin et al. | 427/255.35 |
| 2007/0181867 A1 | 8/2007 | Hewak et al. | 257/4 |
| 2007/0215853 A1 | 9/2007 | Park et al. | 257/4 |
| 2007/0221906 A1 | 9/2007 | Hideki et al. | 257/2 |
| 2008/0035907 A1 | 2/2008 | Czubatyl et al. | 257/4 |
| 2008/0169457 A1 | 7/2008 | Hideki et al. | 257/2 |
| 2008/0210924 A1 | 9/2008 | Shin | 257/4 |
| 2009/0004773 A1 | 1/2009 | Park et al. | 438/102 |
| 2009/0280052 A1 | 11/2009 | Xiao et al. | 423/508 |
| 2010/0019216 A1 | 1/2010 | Park et al. | 257/2 |
| 2010/0144087 A1 | 6/2010 | Ha et al. | 438/102 |
| 2010/0181548 A1 | 7/2010 | Tominaga et al. | 257/2 |
| 2010/0193824 A1 | 8/2010 | Kim et al. | 257/98 |
| 2010/0200828 A1 | 8/2010 | Tominaga et al. | 257/2 |
| 2010/0207090 A1 | 8/2010 | Tominaga et al. | 257/2 |

FOREIGN PATENT DOCUMENTS

| | | | |
|---|---|---|---|
| JP | 2001-502848 | 2/2001 | H01L 27/10 |
| JP | 2001-096919 | 4/2001 | B41M 5/26 |
| JP | 2002-203392 | 7/2002 | G11C 13/02 |
| JP | 2002-246561 | 8/2002 | H01L 27/10 |
| JP | 2005-170059 | 6/2005 | B41M 5/26 |
| JP | 2008-182227 | 8/2008 | H01L 27/105 |
| KR | 10-2004-0076225 | 8/2004 | H01L 27/115 |
| KR | 10-2006-0006195 | 1/2006 | H01L 27/115 |
| KR | 10-2006-0016418 | 2/2006 | H01L 27/115 |
| KR | 10-2006-0121895 | 11/2006 | H01L 27/115 |
| WO | WO 2006/083481 | 8/2006 | C23C 16/00 |
| WO | WO 2008/057616 | 5/2008 | C07F 7/30 |
| WO | WO-2008057616 A2 | 5/2008 | |

OTHER PUBLICATIONS

Kolobov, A., et al. (2004), "Understanding the phase-change mechanism of rewritable optical media", *Nature Materials*, 3: 703-708.

Supervised by Okuda, M. (2004), "Technology and materials for future optical memories", 114-115, Partial English Translation.

Supervised by Tsunoda, Y. (2001), "Basis and application of optical disc storage (hikari disc storage no kiso to oyo)", 209, Partial English Translation.

Yamada, N., et al. (2000), "Structure of laser-crystallized $Ge_2Sb_{2+x}Te_5$ sputtered thin films for use in optical memory", *Journal of Applied Physics*, 88(12): 7020-7028.

Office Action dated Oct. 7, 2011 issued in U.S. Appl. No. 12/733,295.

Office Action dated Oct. 7, 2011 issued in U.S. Appl. No. 12/733,296.

Office Action dated Apr. 12, 2012 issued in U.S. Appl. No. 12/690,711.

Office Action dated May 24, 2012 issued in U.S. Appl. No. 12/733,295.

Office Action dated May 25, 2012 issued in U.S. Appl. No. 12/733,296.

Office Action dated Jul. 25, 2012 issued in U.S. Appl. No. 12/690,711.

Office Action dated Dec. 19, 2012 issued in U.S. Appl. No. 12/733,295.

Office Action dated Dec. 19, 2012 issued in U.S. Appl. No. 12/733,296.

Office Action dated Feb. 27, 2013 issued in U.S. Appl. No. 12/733,296.

Office Action dated Feb. 28, 2013 issued in U.S. Appl. No. 12/733,295.

International Search Report dated Sep. 9, 2008 issued in PCT Application No. PCT/JP2008/060858.

Notice of Allowance dated Aug. 26, 2011 issued in Korean Application No. 10-2010-7006526, No Translation Available.

U.S. Office Action issued in U.S. Appl. No. 13/923,454, dated Oct. 6, 2014.

U.S. Office Action issued in U.S. Appl. No. 13/923,454, dated Mar. 4, 2015.

\* cited by examiner

White circle represents Te,
black circle represents Sb,
black triangle represents Ge.

White circle represents Te,
black circle represents Sb,
black triangle represents Ge.

a combined state

F I G. 5
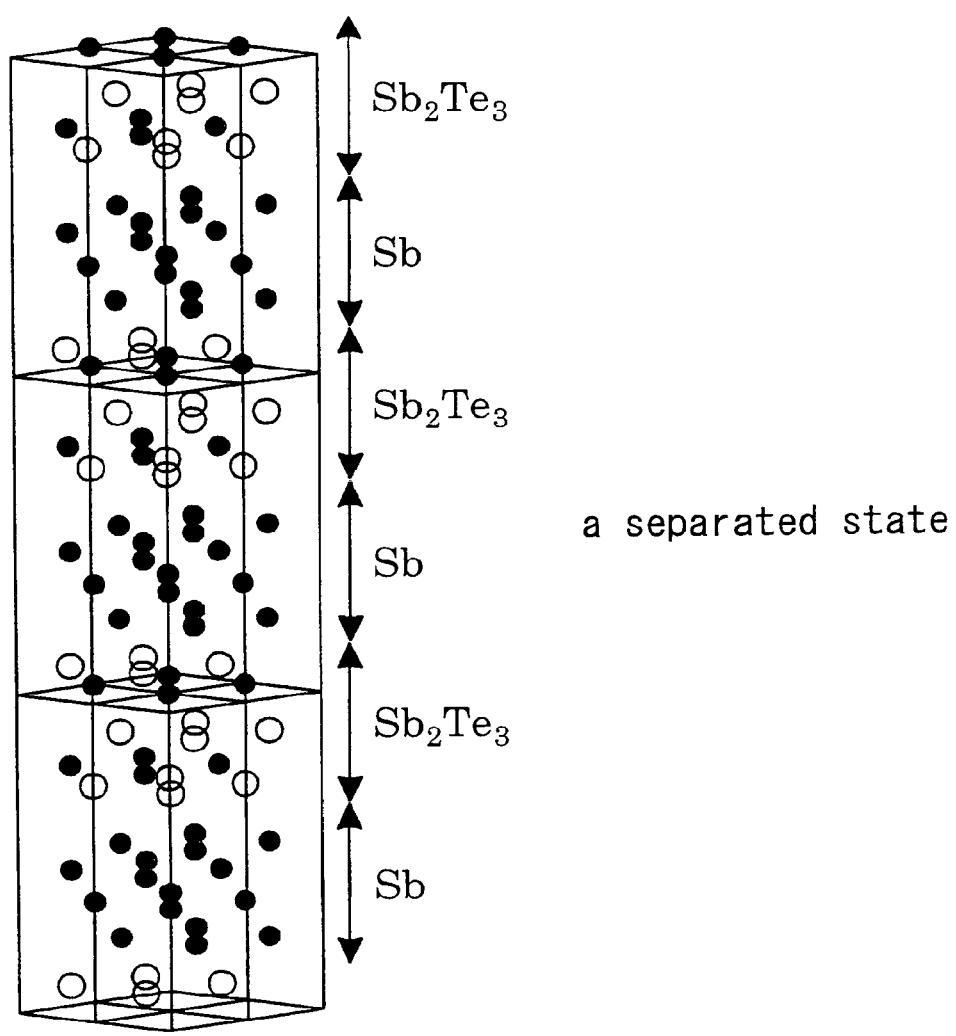

SOLID MEMORY

PRIORITY STATEMENT

The present application is a continuation of pending U.S. application Ser. No. 12/733,295, filed 23 Feb. 2010 which is a national stage of PCT/JP2008/060856, filed 13 Jun. 2008 which claims priority to JP 2007-225978, filed 31 Aug. 2007. The above referenced applications are incorporated herein by reference in its entirety.

TECHNICAL FIELD

The present invention relates to a phase-separation solid memory for recording and erasing, as data, a difference in electric resistance or optical characteristics which is caused by phase-separation (spindle separation) of a chalcogen compound which is a form of phase-change. Because phase-separation is a form of phase-change, the phase-separation solid memory also can be described as a phase-change solid memory (phase-separation RAM, PRAM).

BACKGROUND ART

Recording and erasing of data in phase-change RAM have hitherto been performed based on a change in physical characteristics caused by primary phase-transformation between a crystalline state and an amorphous state of a chalcogen compound including Te which serves as a recording material, and phase-change RAM has been designed based on this basic principle (for example, see Patent Literature 1 below).

A Recording material used for recording and erasing data in a phase-change RAM is generally formed between electrodes by using a vacuum film formation method such as sputtering. Usually, a single-layered alloy thin film made by using a target made of a compound is used as such recording material.

Therefore, a recording thin film of 20-50 nm in thickness consists of a polycrystal but not a single crystal.

A difference in interfacial electric resistance between individual microcrystals influences uniformity in electric resistance values throughout a phase-change RAM as a whole, and causes variations in resistance values in a crystalline state (see Non Patent Literature 1 below).

Furthermore, it is considered that about 10% change in volume generated in phase-transition between a crystalline state and an amorphous state causes individual microcrystals to have different stresses, and flow of material and deformation of an entire film restrict the number of times of readout of record (see Non Patent Literature 2 below).

Patent Literature 1: Japanese Patent Application Publication, Tokukai, No. 2002-203392 A Non Patent Literature 1: supervisor: Masahiro Okuda, Zisedai Hikari Kiroku Gizyutsu to Zairyo (Technology and Materials for Future Optical Memories), CMC Publishing Company, issued on Jan. 31, 2004, p 114

Non Patent Literature 2: supervisor: Yoshito Kadota, Hikari Disc Storage no Kiso to Oyo, edited by The Institute of Electronics, Information and Communication Engineer (IEICE), third impression of the first edition issued on Jun. 1, 2001, p 209

Non Patent Literature 3: Y. Yamanda & T. Matsunaga, Journal of Applied Physics, 88, (2000) p 7020-7028

Non Patent Literature 4: A. Kolobov et al. Nature Materials 3 (2004) p 703

SUMMARY OF INVENTION

Technical Problem

Regarding a crystalline structure and an amorphous structure of a chalcogen compound including Te, the structural analysis has been made by X-ray and so on since the latter 1980s. However, since the atomic number of Te is next to that of Sb atoms which form the compound with Te and the number of electrons of Te is different from that of Sb atoms only by one, X-ray diffraction and electron ray diffraction have hardly succeeded in discriminating Te from Sb. Consequently, detail of the crystalline structure of the chalcogen compound had been unclear until 2004.

Particularly, experiments have demonstrated that characteristics of a compound called GeSbTe (225 composition) and compositions prepared based on a pseudobinary compound (a compound prepared based on GeTe—$Sb_2Te_3$, i.e. 225, 147 and 125 compositions), which have been already commercialized in the field of rewritable optical discs, are very excellent. However, it has been considered that crystalline structures of the compound and the compositions are sodium chloride structures with Te occupying a site (site (a)) which Na occupies and with Ge or Sb occupying a site (site (b)) which Cl occupies, and the way of occupying is random (see Non Patent Literature 3 above).

Solution to Problem

When structural analysis of a GeSbTe compound was made minutely by a synchrotron radiation orbit unit and so on, it was found that a chalcogen compound including Te took on a different aspect from a conventional structure in the following points (see Non Patent Literature 4 above).

1. In a crystalline phase, orderings of Ge atoms and Sb atoms which occupy positions of Cl (site (b)) within NaCl-simple cubic lattices are not in a "random" state as having been considered so far, but positions of orderings of atoms are properly "determined". Furthermore, lattices are twisted (see FIG. 1).

2. In an amorphous state, orderings of atoms are not entirely random, but Ge atoms within crystalline lattices are positioned closer to Te atoms by 2 A from the center (though a bit misaligned and ferroelectric), and the amorphous state has a twisted structure while maintaining its atom unit (see FIG. 2).

3. Restoration of the twisted unit enables high-speed switching to be repeated stably (see FIG. 3).

However, rewritable optical discs without Ge are also commercialized. In DVD-RW and DVD+RW, materials consisting mainly of Sb and additionally containing Te are used, and particularly, composition including $Sb_2Te$ is mainly used.

A model of the GeSbTe alloy including Ge was applied to an alloy including Sb and Te, and the result of the application was minutely analyzed by experiments and computer simulation. As a result, it was found that in a chalcogen compound including Ge, a recording or erasing state is formed by changing positions of Ge atoms as shown in FIG. 1 or FIG. 2, whereas in the alloy including Sb and Te, a large amount of change in optical characteristics and in electric resistance are caused by a little interlaminar separation between a $Sb_2Te_3$ layer and a Sb layer.

From a principle of the interlaminar separation switching which was newly found, it was found that formation of a chalcogen compound without Ge by the following method allows providing a new phase-separation RAM capable of reducing interfacial electric resistance between individual microcrystals as much as possible, and of drastically increasing the number of times of repeated rewriting.

That is, it was found that a new phase-separation RAM which drastically improves characteristics of a conventional phase-change RAM can be provided by artificially forming a chalcogen compound including Sb and Te as a superlattice including a Sb thin film and a $Sb_2Te_3$ thin film, combining a Sb layer with a $Sb_2Te_3$ layer via a weak atomic bond, cutting the combination only in an interlaminar direction by electric energy and forming and fixing a state with high electric resistance (a state of recording (erasing)), and recombining by electric energy and restoring a state with low electric resistance (a state of erasing (recording)).

FIG. 4 illustrates a basic structure of this arrangement. For example, in a case of $Sb_2Te$, the thickness of a Sb layer is about 0.9 nm, and the thickness of a $Sb_2Te_3$ layer is about 0.8 nm. Generally, the thickness of each layer is preferably from 0.3 to 2 nm.

In a case of forming such an artificial superlattice by sputtering, it is preferable that a speed of film formation per time with respect to an electric power required for sputtering be measured in advance by using a compound target including Sb or $Sb_2Te_3$ (or by using single target). By doing this, only controlling a time for the film formation allows easily forming such an artificial superlattice structure including these films.

In a case of forming a single-layered recording film with use of a compound target including composition of Sb and Te, a direction of interlaminar separation within a resulting microcrystal is random with respect to each microcrystal, and electric energy given in order to cut interlaminar combination does not have coherency, hence a lot of heat energy has to be wasted as entropy to a system thermodynamically, whereas in a superlattice structure of the present invention, switching motion by interlaminar combination is performed in a single direction (that is, having coherency) in a recording film as shown in FIG. 4, plentiful input energy is available for energy as a work, and amount of energy wasted as heat (entropy) can be reduced.

Therefore, energy efficiency for performing switching motion by interlaminar combination is improved. Furthermore, limiting a change in volume (change in volume between a crystalline state and an amorphous state) caused by rewriting only to a uniaxial direction (that is, a work) between layers allows operation of stably repeated rewriting without composition segregation.

Advantageous Effects of Invention

With the present invention, formation of a superlattice structure including made of a chalcogen compound with different compositions without Ge enables characteristics of a phase-change RAM having a chalcogen compound including Ge to be improved drastically.

BRIEF DESCRIPTION OF DRAWINGS

FIG. 5 shows a superlattice structure (a separated state) including Sb and $Sb_2Te_3$.

BEST MODE FOR CARRYING OUT THE INVENTION

Best mode for carrying out the present invention is described below.

Example 1

A phase-separation RAM was formed using a basic technique of general self-resistance heating. That is, TiN was used for an electrode. 20 layers of superlattices of Sb and $Sb_2Te_3$ were laminated and the laminate was used as a recording film. The size of a cell is 100×100 $nm^2$ square.

Figure 1:
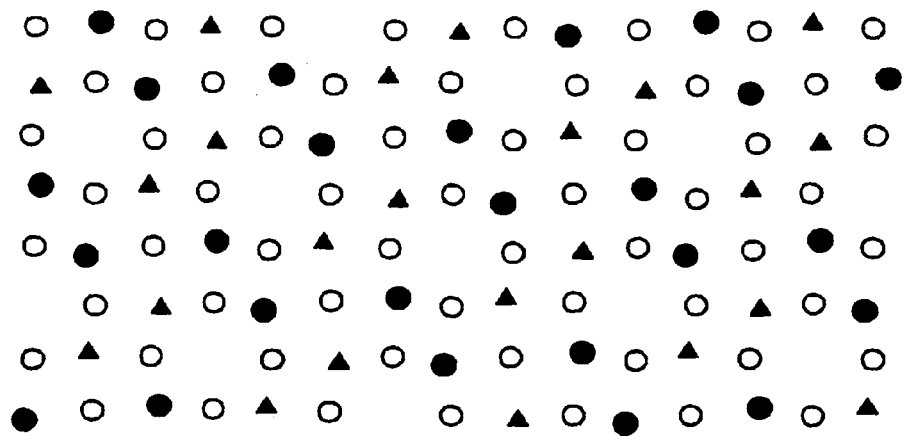
FIG. 1 shows a crystalline structure of Ge—Sb—Te alloy. White circle represents Te, black triangle represents Ge and black circle represents Sb.
Figure 2:
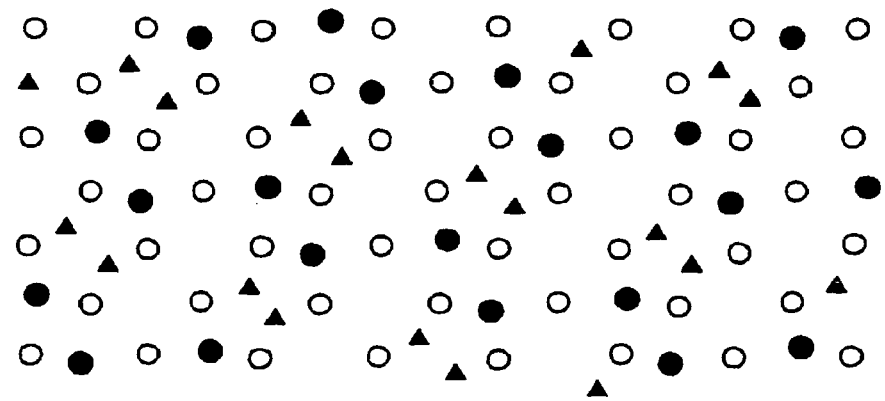
FIG. 2 shows an amorphous structure (short-distance structure) of Ge—Sb—Te alloy.
Figure 3:
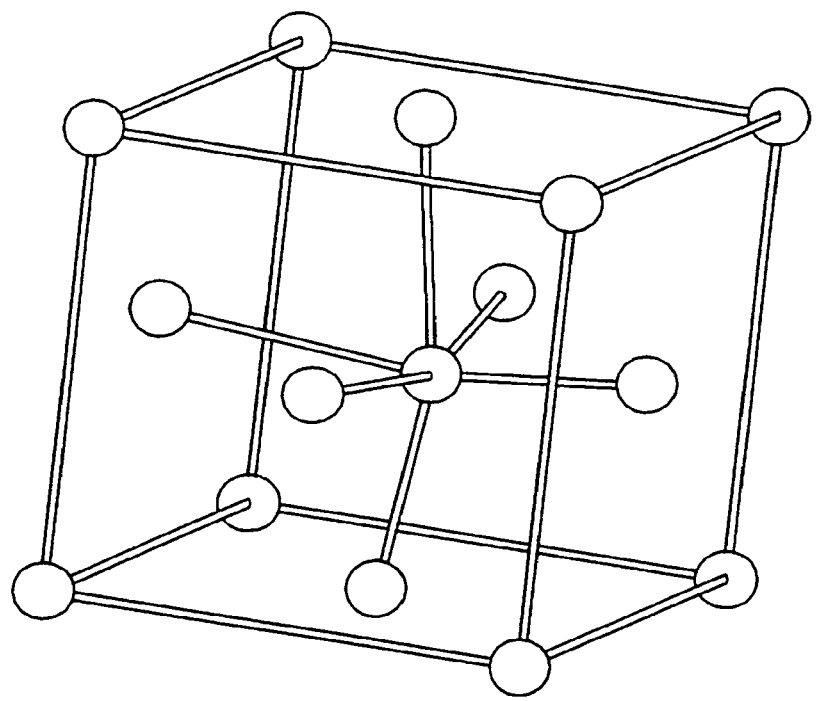
FIG. 3 shows a basic cell for switching of a phase-change RAM.
Figure 4:
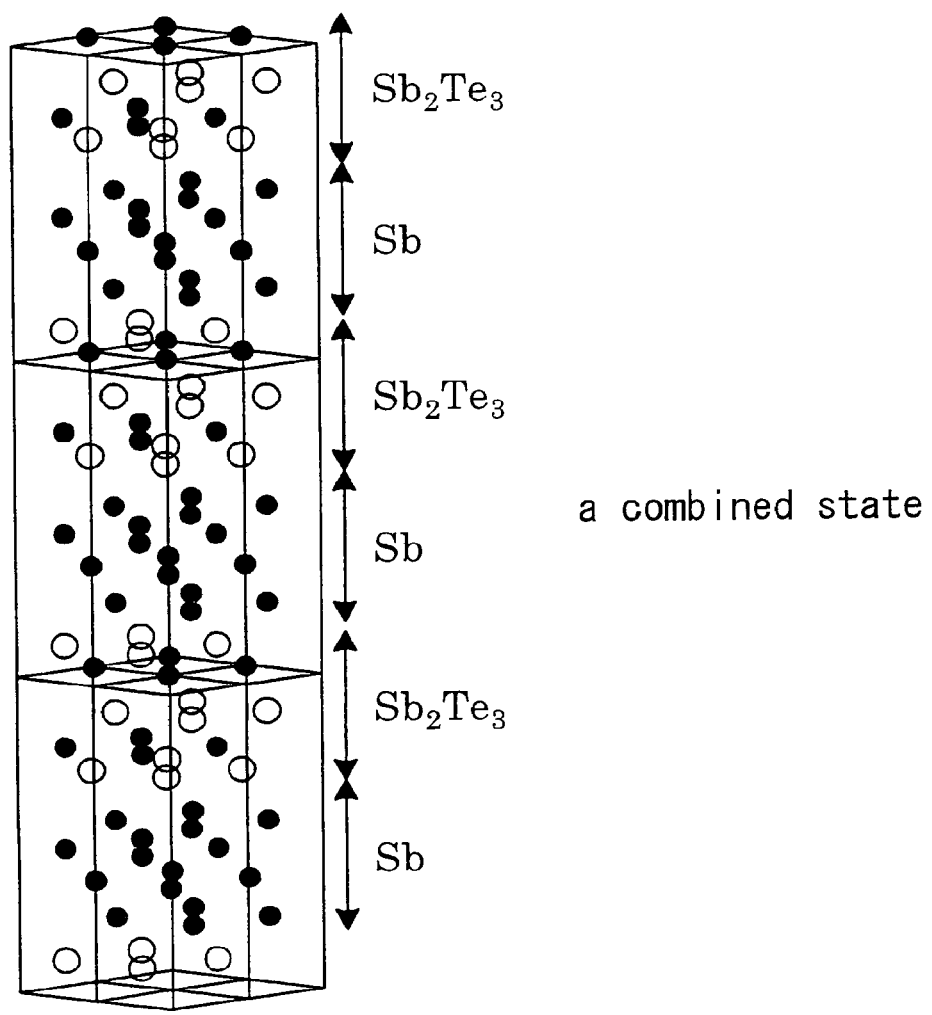
FIG. 4 shows a superlattice structure (a combined state) including Sb and $Sb_2Te_3$.

Comparison between FIG. 4 and FIG. 5 shows that, in FIG. 5, an interface between Sb atoms and Te atoms below the Sb atoms is a bit broader than that in FIG. 4. Such a little difference makes a great difference in electric conductivity.

A voltage was applied on this device programmatically and current values in recording and erasing were measured. The results of the measurements show that in recording, the current value was 0.35 mA and the time of pulse was 5 ns, and in erasing, the current value was 0.08 mA and the time of pulse was 60 ns. The number of times of repeated recording and erasing at these current values was measured to be $10^{14}$.

Reference Example

A phase-change RAM was formed using a technique of general self-resistance heating as in Example 1. A 20 nm single-layered film of $Sb_2Te$ was formed for a recording film. The size of a cell was 100×100 $nm^2$ square. A voltage was applied on this device programmatically and current values in recording and erasing were measured.

As a result, the current value in recording was 1.3 mA and the current value in erasing was 0.65 mA. Note that irradiation time of pulse was the same as in Example 1. The number of times of repeated recording and erasing at these current values was measured to be $10^{11}$.

INDUSTRIAL APPLICABILITY

In the present invention, the current value in recording data in a phase-change RAM can be decreased to be one-tenth or less, and the number of times of repeated rewriting of data can be increased by 2-3 digits or more, compared with a conventional phase-change RAM. Therefore, the present invention can make meaningful contribution to the industry.

The invention claimed is:
1. A method for recording data in a solid memory, comprising:
   recording data in the solid memory by causing phase-separation of a substance constituting the solid memory so as to change electric characteristics of the solid memory, the substance including a laminated structure of alternating thin film layers forming artificial superlattices, the alternating thin film layers including a first thin film layer and a second thin film layer, the first thin film layer being a binary alloy.
2. The method as set forth in claim 1, wherein:
   the first thin film layer includes stibium (Sb) atoms and the second thin film layer includes tellurium (Te) atoms.
3. The method as set forth in claim 2, wherein:
   a thickness of each of the first and second thin film layers ranges from 0.3 to 2 nm.

4. The method as set forth in claim 3, wherein:
the phase-separation is caused by causing interfaces between the first and second thin film layers to be in a one-dimensionally anisotropically separated state.

5. The method as set forth in claim 4, wherein:
the interfaces between the first and second thin film layers are caused to be in the one-dimensionally anisotropically separated state by electric energy.

6. The method as set forth in claim 3, wherein:
the phase-separation is caused by causing interfaces between the first and second thin film layers, having been in a one-dimensionally anisotropically separated state, to be in a recombined state.

7. The method as set forth in claim 6, wherein:
the interfaces between the first and second thin film layers, having been in the one-dimensionally anisotropically separated state, are caused to be in the recombined state by electric energy.

8. The method as set forth in claim 1, wherein the first thin film layer is $Sb_2Te_3$ and the second thin film layer is Sb.

9. The method of claim 1, wherein the second thin film layer is a single-component metalloid.

10. A method for erasing data from a solid memory, comprising:
erasing data from the solid memory by causing phase-separation of a substance constituting the solid memory so as to change electric characteristics of the solid memory, the substance including a laminated structure of alternating thin film layers forming artificial superlattices, the alternating thin film layers including a first thin film layer and a second thin film layer, the first thin film layer being a binary alloy.

11. The method as set forth in claim 10, wherein:
the first thin film layer includes stibium (Sb) atoms and the second thin film layer includes tellurium (Te) atoms.

12. The method as set forth in claim 11, wherein:
a thickness of each of the first and second thin film layers ranges from 0.3 to 2 nm.

13. The method as set forth in claim 12, wherein:
the phase-separation is caused by causing interfaces between the first and second thin film layers, having been in a one-dimensionally anisotropically separated state, to be in a recombined state.

14. The method as set forth in claim 13, wherein:
the interfaces between the first and second thin film layers, having been in the one-dimensionally anisotropically separated state, are caused to be in the recombined state by electric energy.

15. The method as set forth in claim 12, wherein:
the phase-separation is caused by causing interfaces between the first and second thin film layers to be in a one-dimensionally anisotropically separated state.

16. The method as set forth in claim 15, wherein:
the interfaces between the first and second thin film layers are caused to be in the one-dimensionally anisotropically separated state by electric energy.

17. The method as set forth in claim 10, wherein the first thin film layer is $Sb_2Te_3$ and the second thin film layer is Sb.

18. The method of claim 10, wherein the second thin film layer is a single-component metalloid.

19. A method for recording data in a solid memory, comprising:
recording data in the solid memory by causing phase-separation of a substance constituting the solid memory so as to change electric characteristics of the solid memory, the substance including a laminated structure of artificial superlattices, wherein the laminated structure consists of Sb and Te.

20. A method for erasing data from a solid memory, comprising:
erasing data from the solid memory by causing phase-separation of a substance constituting the solid memory so as to change electric characteristics of the solid memory, the substance including a laminated structure of artificial superlattices, wherein the laminated structure consists of Sb and Te.

* * * * *